United States Patent
Sato et al.

(10) Patent No.: US 6,365,231 B2
(45) Date of Patent: *Apr. 2, 2002

(54) AMMONIUM HALIDE ELIMINATOR, CHEMICAL VAPOR DEPOSITION SYSTEM AND CHEMICAL VAPOR DEPOSITION PROCESS

(75) Inventors: Yuusuke Sato, Bunkyo-Ku; Takashi Kataoka, Kawasaki; Naoki Tamaoki, Setagaya-Ku; Toshimitsu Ohmine, Meguro-Ku, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/344,484

(22) Filed: Jun. 25, 1999

(30) Foreign Application Priority Data

Jun. 26, 1998 (JP) ............................................. 10-180436

(51) Int. Cl.$^7$ ................................................ C23C 16/34
(52) U.S. Cl. ........................... 427/255.39; 427/255.393; 427/255.394
(58) Field of Search ...................... 427/255.39, 255.393, 427/255.394

(56) References Cited

U.S. PATENT DOCUMENTS 5,874,368 A * 2/1999 Laxman et al.

FOREIGN PATENT DOCUMENTS

| JP | 2-138371 | | 5/1990 |
|----|----------|---|--------|
| JP | 2-138471 | | 5/1990 |
| JP | 3-016905 | | 1/1991 |
| JP | 4-55398 | | 2/1992 |
| JP | 4-59971 | | 2/1992 |
| JP | 5-251354 | | 9/1993 |
| JP | 06-021048 | * | 1/1994 |
| JP | 6-042182 | | 2/1994 |
| JP | 6-132284 | | 5/1994 |
| JP | 7-249618 | | 9/1995 |
| JP | 8-227890 | | 9/1996 |

OTHER PUBLICATIONS

Translation of Proceedings of the 63rd Annual Symposium of The Society of Chemical Engineers, Japan, p. 260, Proceedings published on Feb. 24, 1998.

* cited by examiner

Primary Examiner—Timothy Meeks
(74) Attorney, Agent, or Firm—Foley & Lardner

(57) ABSTRACT

The present invention provides a chemical vapor deposition using, as feed gases, a silicon compound and hydrazine or a derivative thereof, or a compound containing both silicon and nitrogen, and a process and a system useful for chemical vapor deposition growth, in which a chlorinated silane compound and ammonia, feed gases, are preliminarily reacted with each other, and the resulting reaction gas mixture from which the ammonium halide produced by the preliminary reaction has been eliminated is fed to form a thin film on a substrate.

8 Claims, 4 Drawing Sheets

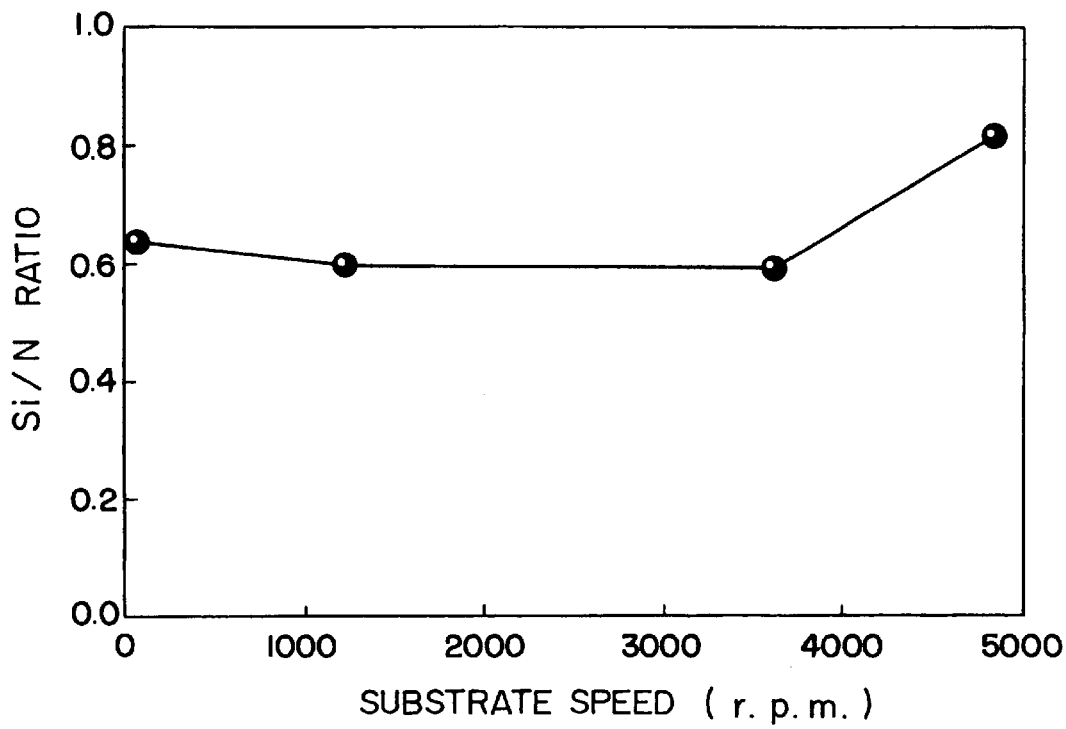
F I G. 4
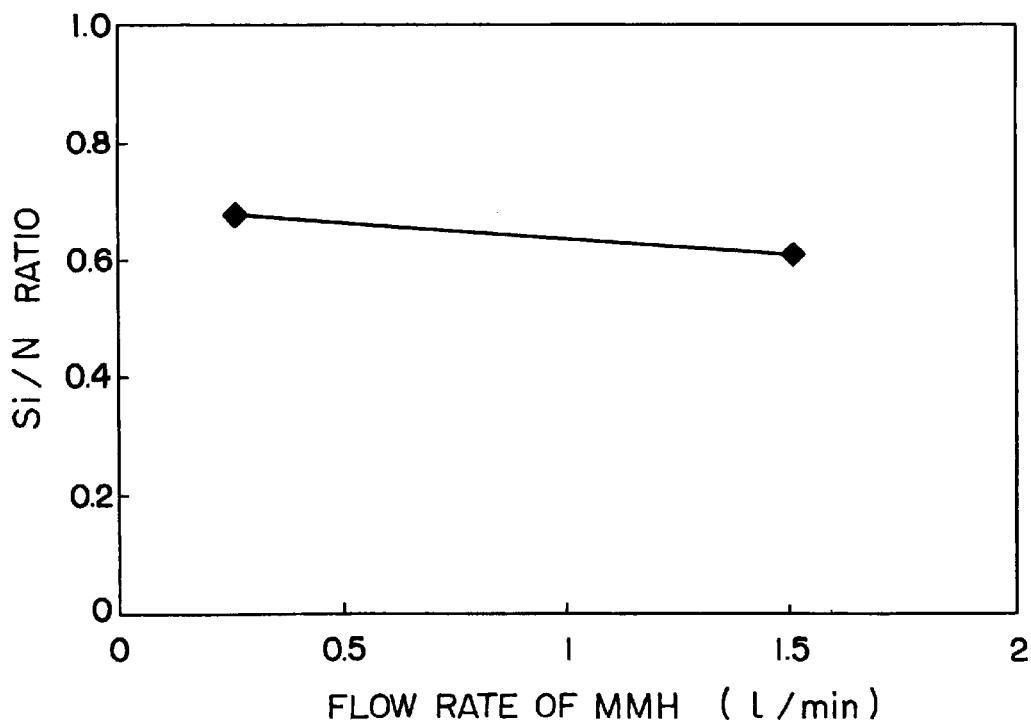
F I G. 5

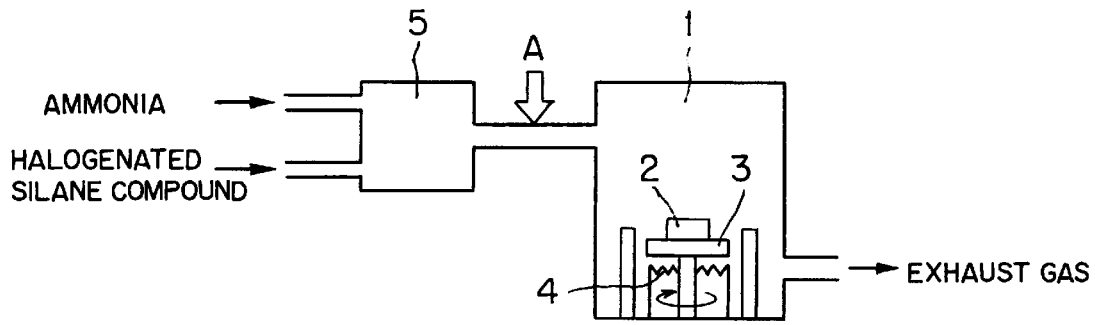
F I G. 6
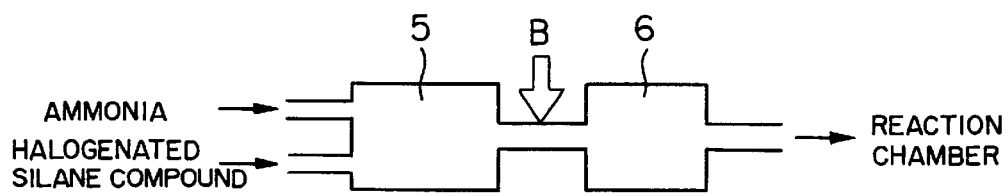
F I G. 7
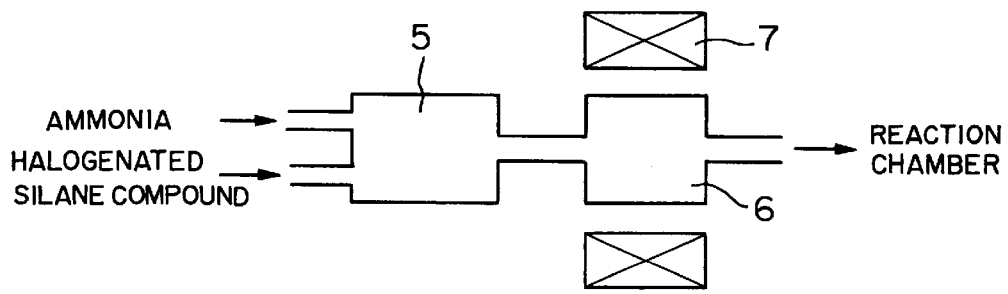
F I G. 8

AMMONIUM HALIDE ELIMINATOR, CHEMICAL VAPOR DEPOSITION SYSTEM AND CHEMICAL VAPOR DEPOSITION PROCESS

BACKGROUND OF THE INVENTION

1. Field of the Invention

The present invention relates to a chemical vapor deposition process and a chemical vapor deposition system that can be used for the production of semiconductors or the like. More particularly, the present invention relates to a process for forming a silicon nitride film on the surface of a semiconductor substrate by means of vapor phase deposition, and to a system for use with the process.

2. Related Art

In order to grow a silicon nitride ($SiN_x$) film on the surface of a semiconductor substrate, there has conventionally been employed a CVD (Chemical Vapor Deposition) process or the like, usually using dichlorosilane and ammonia as feed gases. This is because such a process can give thin films excellent in step coverage inside trenches and in thickness uniformity of wafers.

However, when dichlorosilane and ammonia are used as feed gases, ammonium chloride is produced as the reaction product. Dichlorosilane and ammonia react with each other to give said compound such as ammonium chloride at room temperature when they are simply mixed, so that, when they are fed to a reaction chamber after being mixed, those pipes which are connected to the reaction chamber tend to be clogged and solid particles are also fed to the reaction chamber with feed gases.

Therefore, the mixing of dichlorosilane and ammonia has conventionally been conducted just before the reaction chamber, as close to it as possible, or inside the reaction chamber. In this case, however, those pipes, valves or pumps which are laid or placed after the reaction chamber tend to be clogged.

Further, the ammonium chloride can remain on wafers as particles, and this would be the cause of lowering of yield in the production of semiconductor devices.

Furthermore, the ammonium chloride is unfavorably deposited on exhaust tubes or pumps, so that production systems require periodic maintenance. The productivity of the systems thus becomes low.

In order to solve the foregoing problems, there has been attempted to use monosilane and ammonia in combination as feed gases. However, with this combination, although ammonium chloride is not produced, it is difficult to obtain thin films excellent in coverage and in thickness uniformity.

Under these circumstances, in order to produce thin films excellent in coverage and in thickness uniformity at high productivity, there have been demanded a process and a system for producing silicon nitride films, free from the lowering of yield that would be caused by ammonium chloride, or a process and a system for forming silicon nitride films without producing ammonium chloride.

SUMMARY OF THE INVENTION

A first chemical vapor deposition process according to the present invention is such that a silicon compound and a compound selected from the group consisting of hydrazine and derivatives thereof are used as feed gases to form a silicon nitride film on a substrate having recess and/or projection.

A second chemical vapor deposition process according to the present invention is a process for growing a silicon nitride film on a substrate by using, as feed gases, a silane compound and ammonia and derivatives and/or hydrazine and derivatives, in which the halogenated silane compound and the $NH_3$ are preliminarily reacted with each other, and the resulting reaction gas mixture is fed after the ammonium halide produced by the preliminary reaction has been removed from the reaction gas mixture, thereby forming a silicon nitride film on the substrate.

A third chemical vapor deposition process of the present invention is such that a compound containing both silicon and nitrogen is used as a feed gas to form a silicon nitride film on a substrate.

Further, a chemical vapor deposition system of the present invention comprises:

- a feeder for a silane compound,
- a feeder for ammonia or its derivatives or hydrazine or its derivatives,
- a preliminary reaction chamber for carrying out a preliminary reaction between the silane compound and the ammonia or hydrazine derivatives,
- an apparatus for eliminating, from the reaction gas mixture, the solid compound such as ammonium halide produced by the preliminary reaction carried out in the preliminary reaction chamber, and
- a reaction chamber for forming a silicon nitride film on a substrate placed in the chamber by using the reaction gas mixture from which the solid compound such as ammonium halide has been eliminated.

According to the present invention, it is possible to drastically improve yield in the production of semiconductor devices in which silicon nitride films are formed on substrates by means of chemical vapor deposition, and the productivity of systems for producing semiconductor devices.

According to one aspect of the invention, there has been provided, a chemical vapor deposition process including the steps of: feeding to a reaction chamber a feed gas containing a compound selected from the group consisting of $SiH_{4-x}(NH_2)_x$, where $x \geq 2$, $Si(NH)_2$, $(SiH_2NH)_x$, where $x \geq 1$, $(Si_2NH)_x$, where $x > 1$, and $NH_2(SiH_2NH)_x SiH_2NH_2$, where $x \geq 1$, and forming a silicon nitride film on a substrate placed in the reaction chamber using the feed gas.

BRIEF DESCRIPTION OF THE DRAWINGS

In the drawings,

FIG. 4 is a graph showing the change in the composition of the silicon nitride film brought about when the rotation speed of the wafer is varied in a chemical vapor deposition process of the present invention;

FIG. 5 is a graph showing the change in the composition of the silicon nitride film brought about when the feed rate of monomethylhydrazine, feed gas, is varied in a chemical vapor deposition process of the present invention;

FIG. 6 is a schematic view showing one example of chemical vapor deposition systems of the present invention;

FIGS. 7 and 8 are schematic views showing preliminary reaction systems that can be used in a chemical vapor deposition system of the present invention.

DETAILED DESCRIPTION OF THE INVENTION

First Chemical Vapor Deposition Process

The first chemical vapor deposition process according to the present invention can give thin films excellent in coverage and in thickness uniformity without producing ammonium chloride.

<Silicon Compound>

Any silicon compound can be used in the present invention as long as it can be used for chemical vapor deposition. Preferable examples of such compounds are silan compounds (e.g., monosilane, disilane, trisilane and tetrasilane). Halides or organic derivatives of silane compounds can also be used; and fluorides are preferred among the halides. The most preferred are monosilane and disilane. Further, any combination of these silicon compounds may also be used.

<Hydrazine and Derivatives Thereof>

Hydrazine or any derivative thereof can be used in the present invention as long as it can be used for chemical vapor deposition. Of these compounds, those ones having the following formula (I) are preferred:

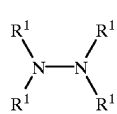

(I)

wherein $R^1$s, which may be the same or different, are H, F, or a hydrocarbon group having 1 to 3 carbon atoms, which may be substituted with fluorine.

Of those compounds which are represented by the above formula (I), the most preferred are hydrazine ($H_2NNH_2$), monomethylhydrazine ($H_2NNHCH_3$), N,N-dimethylhydrazine ($H_2NN(CH_3)_2$) and t-butylhydrazine ($H(CH_3)_3NNH_2$). Any combination of these hydrazine compounds may also be used. Moreover, it is also possible to feed any of these hydrazine compounds along with $NH_3$.

<First Chemical Vapor Deposition Process>

The first chemical vapor deposition process according to the present invention is characterized in that the above-described silicon compound and hydrazine or derivative thereof are used as feed gases to form a silicon nitride film on a substrate having difference in level. It is noted that other gases can additionally be used as feed gases within such limits that the effects of the present invention would not be marred. The term "difference in level" as used herein means trenches on a substrate.

Figure 1:
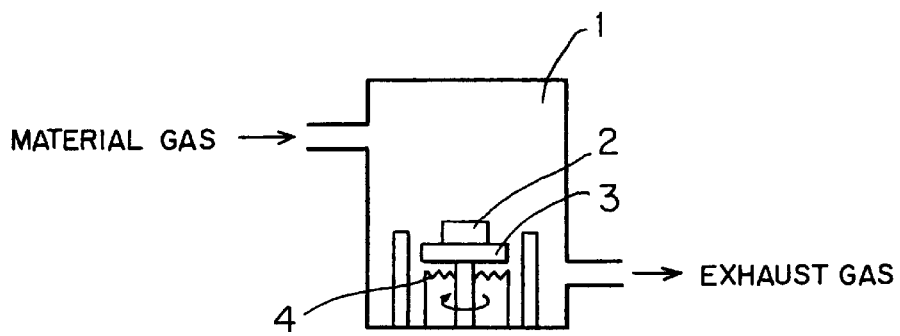
FIG. 1 is a schematic view showing a chemical vapor deposition system that can be used for a chemical vapor deposition of the present invention.

The chemical vapor deposition process may be effected by the use of a conventional chemical vapor deposition growth system, for instance, the system as shown in FIG. 1, under any condition. It is however preferable to effect the process at a temperature of 500 to 800° C., at a pressure of 0.1 to 760 Torr.

In one embodiment of the chemical vapor deposition process of the present invention, a substrate, in general, a semiconductor substrate, on which a silicon nitride film will be formed, is rotated in the direction horizontal to the thin-film- depositing plane so that the resulting thin film will be uniform. Any rotation speed of substrate may be used; however, it is preferable to rotate the substrate at a speed ranging from 50 to 5,000 rpm. By controlling this rotation speed, it is possible to control the composition of the resulting silicon nitride film.

Further, there is also no particular limitation on the blend ratio between the silicon compound and the hydrazine or derivative thereof, feed gases, and on the feed rates of these compounds. In general, the blend ratio (molar ratio) of the silicon compound to the hydrazine or derivative thereof is from 1:1 to 1:100. As for feed rate, when a silicon nitride film is tried to be formed, for example, on a substrate having a diameter of 20 cm, a silicon compound feed gas is fed at a feed rate of 0.01 to 10 litter/minute.

By controlling the above-described chemical vapor deposition growth conditions, it is also possible to control the properties of the resulting silicon nitride film.

Figure 3:
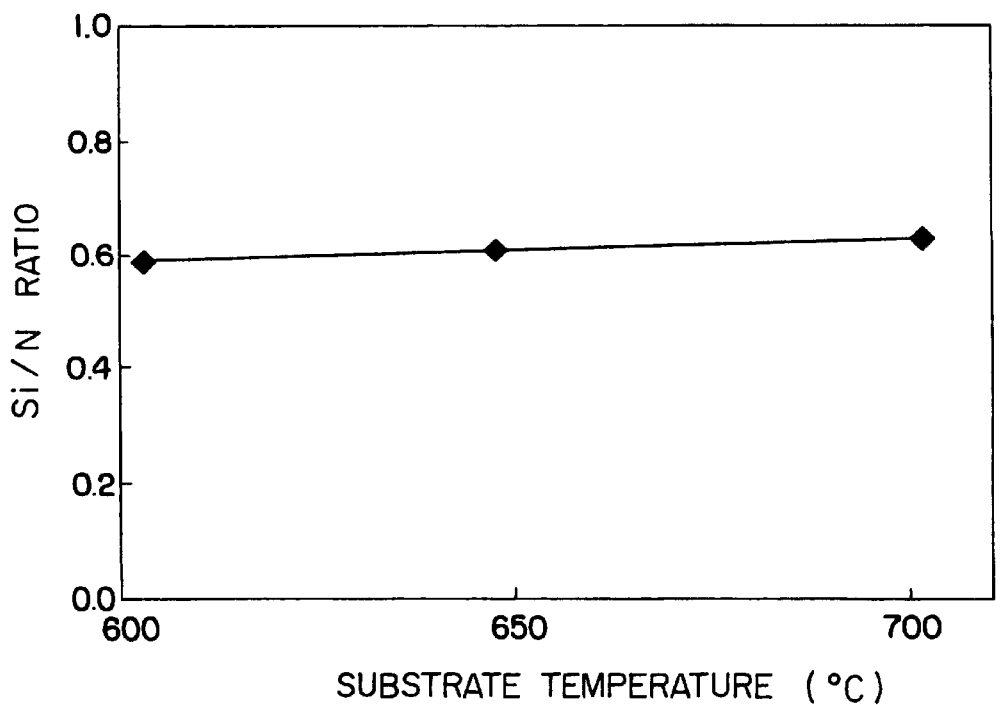
FIG. 3 is a graph showing the change in the composition of the silicon nitride film brought about when the substrate temperature is varied in a chemical vapor deposition process of the present invention.

Silicon nitride is most typically represented by $Si_3N_4$. However, the chemical composition of actual silicon nitride is not stoichiometrical. For instance, as shown in FIGS. 3 to 5, when the substrate temperature is raised, or when the feed rate of the feed gas is increased, the Si/N ratio becomes small, while, when the rotary speed of the substrate is increased, the Si/N ratio tends to become great. Further, the blend ratio of the silicon compound to the hydrazine or derivative thereof is generally selected from the range of 1:1 to 1:100, and it is also possible to change the composition of the resulting silicon nitride film by varying this blend ratio.

Any system can be used for such a chemical vapor deposition process of the present invention as long as it can commonly be used for chemical vapor deposition.

Second Chemical Vapor Deposition Process

The second chemical vapor deposition process of the present invention is to form a silicon nitride film by allowing feed gases to preliminarily react with each other to produce an ammonium halide, by-product, by which many troubles have conventionally been caused, and feeding the resulting gas mixture from which the ammonium halide has been eliminated.

<Feed Gases>

Feed gases that can be used for the second chemical vapor deposition according to the present invention are a silane compound and ammonia or hydrazine compounds. There is no particular limitation on the silane compound; however, chlorinated silane compounds are preferred. Preferable examples of chlorinated silane compounds include chlorides of monosilane, disilane, trisilane and tetrasilane, and more specifically, dichlorosilane, chlorosilane, dichlorodisilane and the like.

Although the silane compounds for use in the present invention are preferably chlorinated silane compounds, they may also be those ones which are substituted with, in addition to chlorine, organic groups or fluorine. Further, any combination of these silane compounds may be used. Moreover, in addition to the silane compound and ammonia or hydrazine compounds, other gases can be used within such limits that the effects of the present invention would not be marred.

<Second Chemical Vapor Deposition Process>

The second chemical vapor deposition process of the present invention is to form a silicon nitride film on a substrate by carrying out a preliminary reaction between the above feed gases, and feeding the resulting reaction gas mixture from which the solid compounds such as ammonium halide produced by the preliminary reaction has been eliminated.

The preliminary reaction is carried out by means of mixing. The preliminary reaction may be accelerated, if necessary, by stagnating the mixture of the feed gases, and stirring it.

The silane compound and the ammonia or hydrazine compound gas can be used in any blend ratio; however, the blend ratio (molar ratio) of the silane compound to the ammonia or hydrazine compound is generally from 1:1 to 1:100. In general, the preliminary reaction is carried out at a temperature of 0 to 500° C. at a pressure of 0.1 to 760 Torr.

By mixing the feed gases, they react with each other to give solid compounds such as an ammonium halide, silicon, and compounds containing silicon, nitrogen, chlorine and hydrogen. Although this ammonium halide is gaseous at high temperatures at which chemical vapor deposition growth is usually allowed to proceed, it is solidified at around room temperature and separated.

In the second chemical vapor deposition process of the present invention, the solid compounds such as ammonium halide is intentionally allowed to separate out during this preliminary reaction, and the resulting reaction gas mixture from which the solid compound such as ammonium halide has been eliminated is fed to the chemical vapor deposition growth reaction. Any means can be employed in order to eliminate the ammonium halide precipitated. For instance, the following method may be adopted: a method in which immediately after mixing a silane compound and ammonia or silane compound, the gas mixture is introduced, as shown in FIG. 6, into a pipe having a large diameter so that the solid compound such as ammonium halide produced can be precipitated in the pipe, and chemical vapor deposition growth is then allowed to proceed by replacing, if necessary, the pipe with a different large-diameter pipe; a method in which immediately after mixing the feed gases, the gas mixture is introduced into a storage tank having a large capacity, and the ammonium halide produced is allowed to accumulate in the tank; or a method in which the ammonium halide produced is eliminated by using a proper filter. By properly controlling the temperature of the section at which the ammonium halide is separated, it becomes possible to eliminate the ammonium halide more efficiently. For instance, the temperature of such a section is adjusted to a temperature lower than the sublimation temperature of the ammonium halide, and, at the same, to a temperature at which the reaction product of the preliminary reaction that will contribute to the formation of a silicon nitride film does not precipitate (e.g., 0° C.).

By thus eliminating the ammonium halide beforehand, the problem of particle contamination that is caused in a reaction chamber used for chemical vapor deposition growth can be avoided.

The mixture of the feed gases from which the solid compound such as ammonium halide has been eliminated is then fed to the reaction chamber to subject it to the chemical vapor deposition growth reaction. Before this step, the mixture of the feed gases may be blended with other gases, as needed. Examples of such gases include hydrochloric acid gas and ammonia gas, which can contribute to chemical vapor deposition growth.

In general, the preliminary reaction is carried out in one step; however, it can also be conducted in two steps, if necessary. In the latter case, the preliminary reaction conditions such as temperature and pressure for the first step and those for the second step can be made different from each other; and other gases, for example, hydrochloric acid gas and ammonia gas can further be added after the first step of the preliminary reaction.

The reaction conditions under which the chemical vapor deposition growth reaction is carried out are generally such that the temperature is from 600 to 1,000° C. and that the pressure is from 0.1 to 760 Torr.

Further, it is also possible to store the reaction gas mixture obtained by carrying out the preliminary reaction between a silane compound and ammonia or hydrazine compounds, and then eliminating the solid compound such as ammonia halide produced. Under the chemical vapor deposition growth reaction conditions, the gas that has been stored is introduced at desired time into a reaction chamber containing a substrate on which a silicon nitride film will be formed, thereby producing a silicon nitride film on the substrate.

This second chemical vapor deposition process can be effected by the use of a specific chemical vapor deposition growth system. This system comprises:

a feeder for a silane compound;

a feeder for ammonia and/or hydrazine compounds;

a preliminary reaction chamber for carrying out a preliminary reaction between the silane compound and the ammonia or hydrazine compounds;

an apparatus for eliminating, from the reaction gas mixture, the solid compounds such as ammonium halide produced by the preliminary reaction carried out in the preliminary reaction chamber; and a reaction chamber for forming a silicon nitride film on a substrate placed in the chamber by using the reaction gas mixture from which the solid compounds such as ammonium halide has been eliminated.

An example of such a chemical vapor deposition system is as shown in FIG. 6. This system is composed of a reaction chamber 1, a turn table 3 to which a substrate will be fixed, placed in the reaction chamber, a heater 4 for heating a substrate, and a preliminary reaction chamber 5. A substrate 2 is fixed to the turn table 3, and the feed gases fed via the preliminary reaction chamber 5 are heated by the heater 4, whereby a thin film is formed on the substrate 2. A batch type reactor can be used.

For the preliminary reaction chamber 5 and the apparatus for eliminating the solid compounds such as ammonium halide produced, the previously-mentioned ones can respectively be used. Further, a two-stage preliminary reaction system as shown in FIG. 7 may also be used. This preliminary reaction system is composed of preliminary reaction chambers 5 and 6. The preliminary reaction chamber 5 may also be provided with an apparatus for introducing other gases into the reaction gas mixture after the preliminary reaction is completed. Such a means can also be used for the two-stage preliminary reaction system. This means is provided at the part A shown in FIG. 6, or at the part B shown in FIG. 7.

The product gas of the preliminary reaction between $SiH_2Cl_2$ and $NH_3$ can contain a highly reactive gas. Such a highly reactive gas can make the coverage worse. When this highly reactive gas is allowed to pass through a reaction pipe at a temperature almost equal to the thin film deposition temperature, the gas immediately produces deposits on the reaction pipe, and is thus consumed. On the other hand, a gas with low reactivity hardly produces deposits even when it is allowed to pass through a reaction pipe at a temperature near the reaction temperature. Therefore, by making the temperature of the preliminary reaction pipe almost equal to the thin film deposition temperature so that a highly reactive gas can be consumed during the period of residence time, a film excellent in coverage can be obtained. Specifically, by allowing the product gas of the preliminary reaction to pass through the preliminary reaction pipe whose temperature had been adjusted to almost equal to the thin film deposition temperature by the use of an electric furnace 7 as shown in FIG. 8, a film excellent in coverage was able to be obtained by feeding a gas having low reactivity to the reaction chamber.

The reaction mechanism in the first and second chemical vapor deposition processes according to the present invention are considered to be as follows:

First of all, the reaction between $SiH_2Cl_2$ and $NH_3$ is given as an example. The reaction mechanism is considered as follows:

As Reaction (1) shows, $SiH_2Cl_2$ and $NH_3$ react with each other to give $SiH_2ClNH_2$ and HCl. Further, as Reaction (2) shows, $SiH_2ClNH_2$ reacts with $NH_3$ to give $SiH_2(NH_2)_2$ and HCl. $SiH_2(NH_2)_2$ is decomposed into $Si_2H_2NH$ and $NH_3$ as shown by Reaction (3). On the other hand, $SiH_2ClNH_2$ reacts with $SiH_2Cl_2$ to produce $NH(SiH_2Cl)_2$ as shown by Reaction (4). As Reaction (5) shows, when $NH(SiH_2Cl)_2$ is reacted with $NH_3$, $NH_2SiH_2NHSiH_2Cl$ is produced. As Reaction (6) shows, $NH_2$ group and Cl group present in the $NH_2SiH_2NHSiH_2Cl$ molecule react with each other to yield a cyclic compound $(NHSiH_2)_2$ and HCl. By the reaction between $NH_2SiH_2NHSiH_2Cl$ and $NH_3$, $NH_2SiH_2NHSiH_2NH_2$ is produced.

As mentioned above, when Si—Cl bond contained in the starting materials or in the reaction products reacts with $NH_3$, the Cl atom is substituted by $NH_2$ group; and, when $NH_2$ group in the reaction products reacts with Si—Cl bond, N—Si bond is formed. In the case where the starting material is $SiHCl_3$ or $SiCl_4$, $SiH(NH_2)_3$ or $Si(NH_2)_4$, for example, is produced. As the reaction proceeds, Si—N bond is complicatedly combined with other bonds, and compounds having the structure of $NH_2(SiH_2NH)_xSiH_2NH_2$, cyclic compounds $(NHSiH_2)_x$, compounds having branching of 2 to 4 nitrogen atoms attached to Si atom, and the like are produced. It is noted that the same reactions can occur even when the Cl atom is replaced with other halogen atoms.

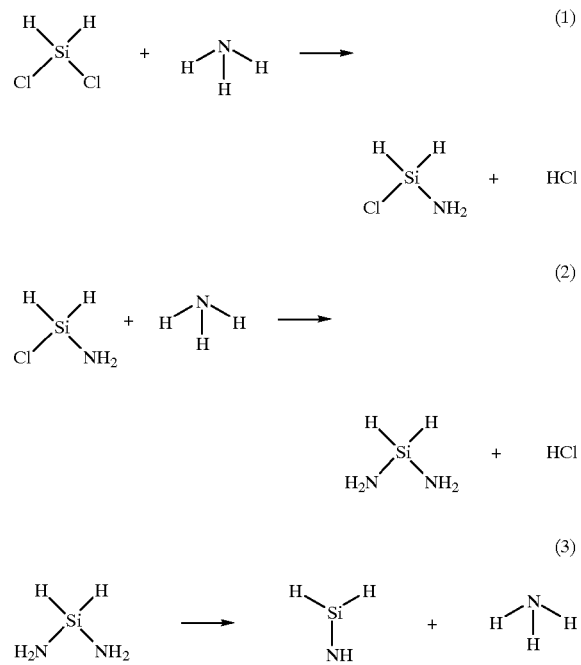

(4)

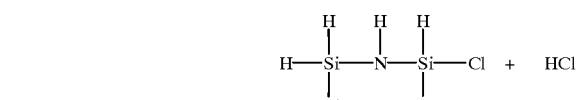

(5)

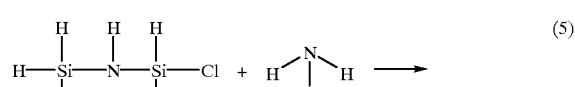

(6)

(7)

The reaction between $Si_2H_6$ and monomethylhydrazine is considered as follows: $Si_2H_6$ is decomposed into $SiH_2$ as shown by Reaction (8), and this $SiH_2$ is inserted into N—N, N—H or N—$CH_3$ bond present in monomethylhydrazine to form, as shown by Reaction (9), $SiH_2NH_2NHCH_3$, $SiH_3HNNHCH_3$ or the like.

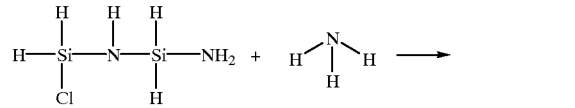

(8)

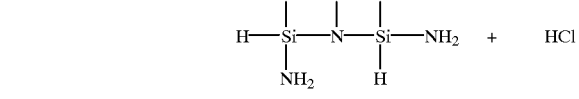

(9)

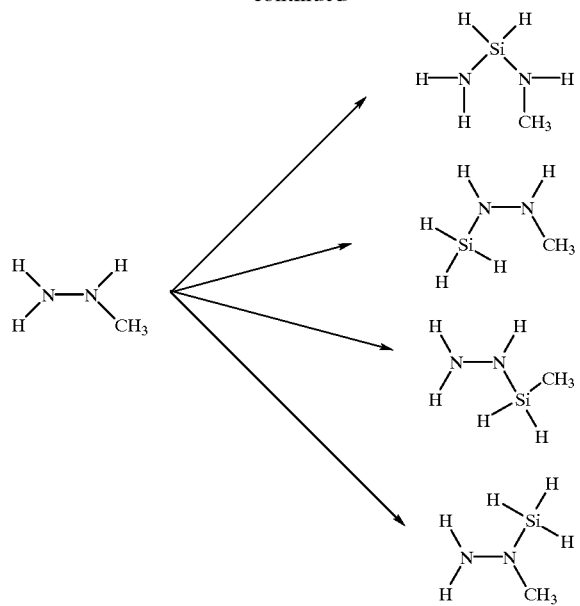

The reaction between SiH$_4$ and NH$_3$ is considered as follows: as shown by Reaction (10), Si$_2$H$_6$ is decomposed into SiH$_2$, and this SiH$_2$ reacts with NH$_3$ to give SiH$_3$NH$_2$, SiHNH$_2$, SiH$_2$(NH$_2$)$_2$, Si(NH$_2$)$_2$, SiH(NH$_2$)$_3$ and the like as shown by Reactions (11) to (13). It is considered that the same reaction proceeds when Si$_2$H$_6$ and NH$_3$ are reacted with each other.

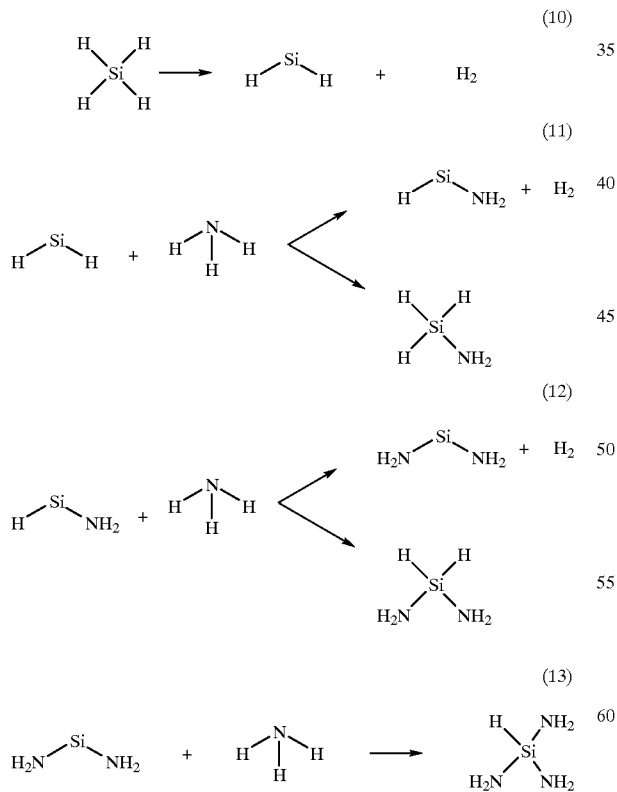

As mentioned above, a variety of reaction products are considered to be produced. If those products in which the proportion of N is higher than that of Si are selected from these reaction products and used, Si-rich SiN films are scarcely formed. Further, in order to obtain the desired film-depositing properties, a compound which is free of NH$_3$ and halogens, selected from the above-described compounds may be used as the feed gas; or any of the above-described compounds and HCl may be used as the feed gases. Moreover, a plurality of compounds may be selected from the above-described compounds.

By making the feed rate of a compound selected from the group consisting of ammonia, hydrazine and derivatives thereof excessively higher than that of a silane compound to be fed to the preliminary reaction system, the halogen contained in the halogenated silane compound is to completely react with the ammonia or the like. By this, it becomes easy to eliminate halogen components. Moreover, the reactor and exhaust tube become almost free from deposits; the formation of particles on the wafer is reduced; and the amount of deposits to be formed in the reactor or piping is decreased.

Further, the gas generated by the preliminary reaction is decomposed into ammonia, hydrazine or a derivative thereof when it undergoes either reverse reaction or monomolecular decomposition reaction. Therefore, by adding ammonia, hydrazine or a derivative thereof to the gas generated by the preliminary reaction, it becomes possible to prevent the decomposition of the gas. The same effect can be obtained when the gas produced by the preliminary reaction is stored in an atmosphere containing an excess of ammonia, hydrazine or a derivative thereof.

Third Chemical Vapor Deposition Process

Compound Containing Silicon and Nitrogen

The third chemical vapor deposition process according to the present invention employs, as a feed gas, a compound containing both silicon and nitrogen. Any compound can be used for such a compound as long as it contains both silicon and nitrogen and can be used as a gas for chemical vapor deposition process. of these compounds, those ones represented by the following formula (II) are preferred:

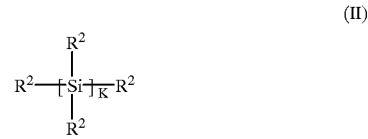

(II)

wherein k is a number of 1 to 4, and R$^2$s, which may be the same or different, are H, F, a hydrocarbon group having 1 to 3 carbon atoms, which may be substituted with fluorine, or an amino group which may be substituted with a hydrocarbon group having 1 to 3 carbon atoms, provided that at least one of the R$^2$s is an amino group which may be substituted with a hydrocarbon group having 1 to 3 carbon atoms.

Although fluorinated hydrocarbon groups may be used as R$^2$, consideration should be given to the molecular weights of such groups. This is because, when the molecular weights of the groups are excessively high, it is difficult to vaporize the compounds containing such groups, and the handling of these compounds can be troublesome. In addition, the compounds represented by the formula (II) may optionally be halogenated. In this case, however, such a problem as the generation of ammonium chloride can be brought about, so that careful consideration should be given to the use of such compounds.

Specific examples of these compounds include H$_2$NSiH$_2$NH$_2$, H$_2$NSiH$_2$NHCH$_3$, H$_2$NSiH$_2$CH$_3$ and the like. Any combination of these compounds can also be used.

<Third Chemical Vapor Deposition Process>

The procedure of the third chemical vapor deposition processes of the present invention is the same as those of conventional chemical vapor deposition processes except that a compound containing both silicon and nitrogen is used as a feed gas. The conditions under which the chemical vapor deposition growth reaction is carried out are generally such that the temperature is from 500 to 1,000° C. and that the pressure is from 0.1 to 760 Torr. The composition of the resulting silicon nitride film can be controlled by controlling these conditions, and this is the same as in the aforementioned first and second chemical vapor deposition processes.

Figure 9:
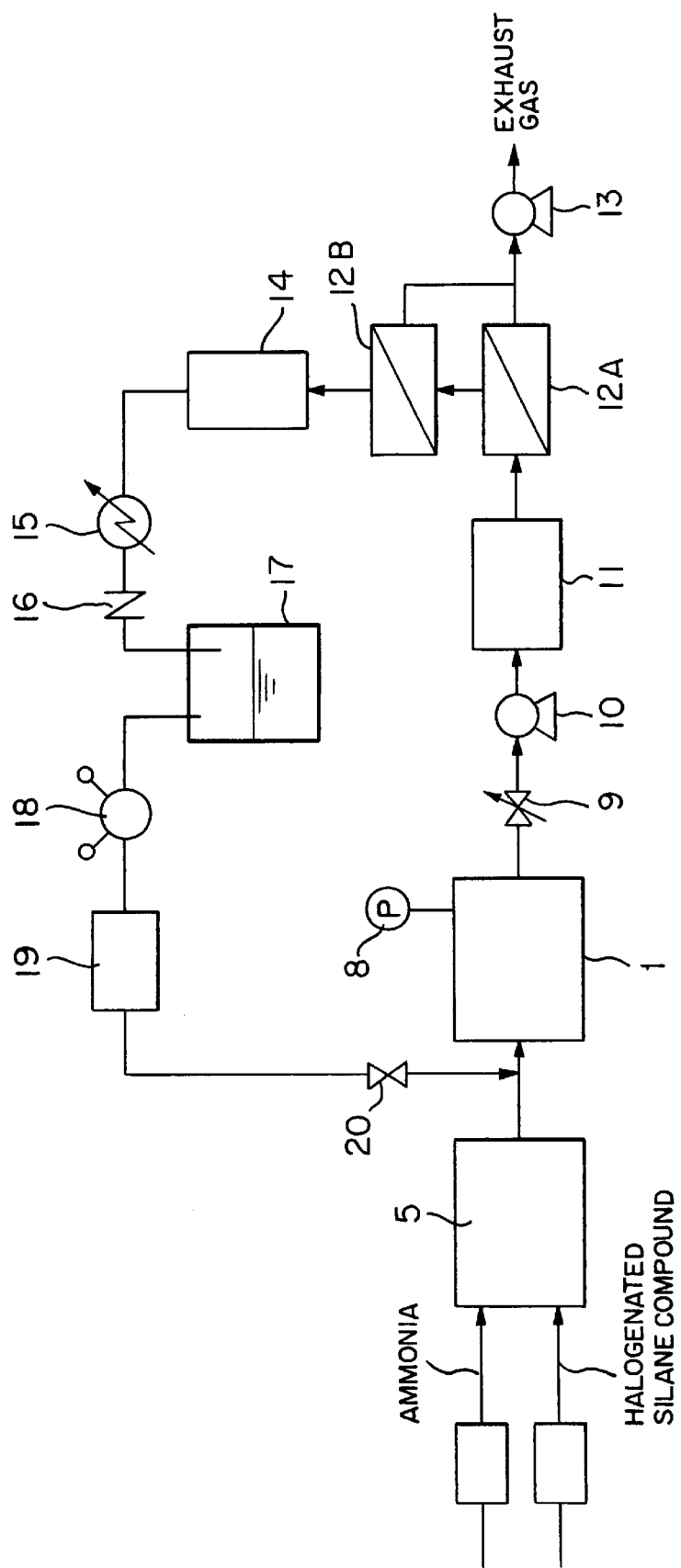
FIG. 9 is a schematic view showing one example of chemical vapor deposition systems of the present invention, comprising an apparatus for recovering depositing species from the exhaust gas.

Further, in the present invention, those depositing species which can form thin films excellent in coverage on trenches have low reactivity, so that they are often contained also in the exhaust gas from the reactor. In such a case, the chemical vapor deposition growth system as shown in FIG. 9 may be used. FIG. 9 is a view showing one example of the case where feed gases, that is, a silane compound and a compound selected from the group consisting of ammonia, hydrazine and derivatives thereof, are preliminarily reacted with each other. In this system, the exhaust gas is introduced into a separator, and the reactant gases separated from the exhaust gas are fed again to the reactor as they are or after they are stored. The apparatus for separating the reactant gases from the exhaust gas include membrane separation, adsorption, distillation and the like.

The case where membrane separation is employed as the means of separation will be described below. A gas fed from a preliminary reaction chamber 5 is subjected to film deposition in a reactor 1, and the unreacted gas is exhausted from the reactor. The pressure inside the reactor is kept at a predetermined pressure by a pressure-controlling valve 9. The gas exhausted is pressurized by a pump 10. The pressurized gas is allowed to pass through a filter 11 to eliminate solid material from the gas, and then fed to a membrane separator 12A. In the membrane separator 12A, those components whose molecular weights are lower than that of the main component fed from the preliminary reaction chamber are firstly separated by a semipermeable membrane, and the gas thus treated is then introduced into a membrane separator 12B in which those components whose molecular weights are higher than that of the main component are separated. The components whose molecular weights are lower and higher than that of the main component fed from the preliminary reaction chamber are exhausted by a pump 13. The gas whose molecular weight is almost equal to that of the main component fed from the preliminary reaction chamber is purified by a purifier 14 filled with an adsorbent. The purified gas is liquefied by a condenser 15, and stored in a reservoir 17. After the pressure of the liquefied gas is controlled by a pressure controller 18, the resultant is fed to the reactor 1.

Although the gas produced in the preliminary reaction chamber has been taken as an example hereinbefore, it is possible to recover depositing species from the exhaust gas in the same manner as the above even in the case where other gases are used. Further, a means other than membrane separation can also be used for the separator.

EXAMPLES

Example 1

Figure 2:
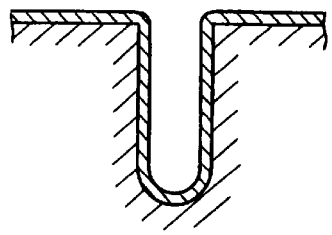
FIG. 2 is a schematic cross-sectional view of a silicon nitride film formed by a chemical vapor deposition process of the present invention.

A silicon nitride film was formed by using $Si_2H_6$ and $H_2NNHCH_3$ (hereinafter referred to as MMH) as the feed gases, and $N_2$ as a carrier gas. A $SiN_x$ film excellent in coverage as shown in FIG. 2 was successfully obtained under the following conditions: the film deposition temperature was in the range of 600 to 700° C.; the pressure was 38 Torr; and the rotation speed of the wafer was 5,000 rpm or less. FIG. 2 is a view showing that coating films uniform in thickness can be obtained even on concavities on a substrate.

Further, it was possible to control the composition of the silicon nitride film by varying the temperature of the substrate, the number of revolutions of the wafer, and the flow rate of the feed gas as shown in FIGS. 3 to 5.

FIG. 3 is a graph showing the change in the Si/N ratio of the film brought about when the temperature of the substrate was varied. The film deposition conditions were as follows: the flow rate of $Si_2H_6$ was 100 cc/m; the flow rate of MMH was 1.5 litter/m; the flow rate of $N_2$ was 7 litter/m; the number of revolutions of the wafer was 1,200 rpm; and the pressure was 38 Torr. This graph demonstrates that the Si/N ratio slightly increases as the temperature is raised within the range shown in this graph.

FIG. 4 is a graph showing the change in the Si/N ratio of the film brought about when the rotation speed of the turn table was varied. The film deposition conditions were as follows: the flow rate of $Si_2H_6$ was 100 cc/m; the flow rate of MMH was 1.5 litter/m; the flow rate of $N_2$ was 7 litter/m; the pressure was 38 Torr; and the temperature was 640° C. This graph demonstrates that the Si/N ratio changes depending on the rotation speed of the wafer.

FIG. 5 is a graph showing the change in the Si/N ratio of the film brought about when the flow rate of MMH was varied. The film deposition conditions were as follows: the flow rate of $Si_2H_6$ was 100 cc/m; the flow rate of $N_2$ was 7 litter/m; the rotation speed of the wafer was 1,200 rpm; the pressure was 38 Torr; and the temperature was 640° C. This graph demonstrates that the Si/N ratio slightly decreases as the flow rate of MMH is increased within the range shown in the graph.

In these film deposition experiments, the unfavorable deposition of ammonium chloride inside the reaction chamber or on the inner surface of the exhaust tube was not confirmed.

Example 2

$SiH_2Cl_2$ and $NH_3$, feed gases, were allowed to react with each other beforehand in the preliminary reaction chamber shown in FIG. 6, and then fed to the reactor to form a silicon nitride film on a substrate.

The temperature of the preliminary reaction chamber was nearly equal to room temperature. The solid compound such as ammonium chloride was produced in the preliminary reaction chamber, and deposited on the inner wall of the preliminary reaction chamber. The diameter of the preliminary reaction chamber was made sufficiently large so that the chamber would not be clogged. A plurality of preliminary reaction chambers were used one after another so that the ammonium chloride deposited inside the preliminary reaction chamber would be able to be removed without suspending the operation of the whole system. A silicon nitride film excellent in coverage was successfully obtained at a film deposition temperature of 800° C. No deposition of ammonium chloride was observed inside the reaction chamber. It was found that ammonium chloride was slightly deposited on the inner surface of the exhaust tube. However, by keeping the temperature of a part of the pipe connecting the preliminary reaction chamber and the reaction chamber 0° C., the precipitation of ammonium chloride on the inner surface of the exhaust tube was not observed anymore.

Further, after carrying out the preliminary reaction between $SiH_4$ and $NH_3$ in the preliminary reaction tube under reduced pressure or at around atmospheric pressure at a temperature of approximately 700° C. in a residence time of about 0.1 to 1 second, the resulting gas was fed to the chemical vapor deposition groewth system. As a result, a film excellent in coverage was successfully obtained.

Example 3

A silicon nitride film was formed on a substrate by employing a conventional chemical vapor deposition process by feeding, as a feed gas, $H_2NSiH_2NH_2$, $H_2NSiH_2NHCH_3$, or $H_2NSiH_2CH_3$. In all cases, films excellent in coverage were obtained, and almost no deposition of the reaction products in exhaust system such as pipe, valve and pump was occurred.

What is claimed is:

1. A chemical vapor deposition process comprising the steps of:

feeding to a preliminary reaction chamber a feed gas containing a halogenated silane compound, and a compound selected from the group consisting of ammonia, hydrazine, ammonia derivatives and hydrazine derivatives;

carrying out a preliminary reaction between the silane compound and the compound selected from the group consisting of ammonia, hydrazine, ammonia derivatives and hydrazine derivatives in the preliminary reaction chamber;

eliminating an ammonium halide produced by the preliminary reaction from a reaction gas mixture produced by the preliminary reaction; feeding from outside of a reaction chamber to a reaction chamber the reaction gas mixture from which the ammonium halide has been eliminated; and forming a silicon nitride film on a substrate placed in the reaction chamber using the reaction gas mixture, wherein, before feeding to the reaction chamber, the reaction gas mixture obtained from the reaction carried out in the preliminary reaction chamber is introduced into a reaction section which is maintained at a temperature almost equal to a film deposition temperature at which the film will be formed on the substrate.

2. The process according to claim 1, wherein the compound selected from the group consisting of ammonia, hydrazine, ammonia derivatives and hydrazine derivatives is a compound represented by the formula (I):

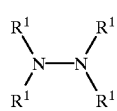

wherein $R^1$s, which may be the same or different, are independently H,F, or a hydrocarbon group having 1 to 3 carbon atoms, which may be substituted with fluorine.

3. The process according to claim 1, wherein the silane compound contains chlorine.

4. The process according to claim 1, wherein the reaction gas mixture obtained by the reaction carried out in the preliminary reaction chamber contains a compound selected from the group consisting of ammonia, hydrazine, ammonia derivatives and hydrazine derivatives.

5. A chemical vapor deposition process comprising the steps of:

feeding to a preliminary reaction chamber a feed gas containing a halogenated silane compound, and a compound selected from the group consisting of ammonia, hydrazine, ammonia derivatives, and hydrazine derivatives;

carrying out a preliminary reaction between the silane compound and the compound selected from the group consisting of ammonia, hydrazine, ammonia derivatives and hydrazine derivatives in the preliminary reaction chamber;

eliminating an ammonium halide produced by the preliminary reaction from a reaction gas mixture produced by the preliminary reaction by controlling the temperature of a section at which the ammonium halide is eliminated;

feeding from outside of a reaction chamber to a reaction chamber the reaction gas mixture from which the ammonium halide has been eliminated; and forming a silicon nitride film on a substrate placed in the reaction chamber using the reaction gas mixture.

wherein, before feeding to the reaction chamber, the reaction gas mixture obtained from the reaction carried out in the preliminary reaction chamber is introduced into a reaction section which is maintained at a temperature almost equal to a film deposition temperature at which the film will be formed on the substrate. gas mixture from which the ammonium halide has been eliminated is mixed with a hydrogen halide gas, and the reaction gas mixture is used to from the silicon nitride film on the substrate.

6. The process according to claim 5, wherein the temperature of the section at which the ammonium halide is eliminated is adjusted to a temperature lower than the sublimation temperature of the ammonium halide. halogenated silane compound contains Cl.

7. A chemical vapor deposition process comprising the steps of:

feeding to a preliminary reaction chamber a feed gas containing a halogenated silane compound, and a compound selected from the group consisting of ammonia, hydrazine, ammonia derivatives and hydrazine derivatives;

carrying out a preliminary reaction between the silane compound and the compound selected from the group consisting of ammonia, hydrazine, ammonia derivatives and hydrazine derivatives in the preliminary reaction chamber;

eliminating an ammonium halide produced by the preliminary reaction from a reaction gas mixture produced by the preliminary reaction; feeding from outside of a reaction chamber to a reaction chamber the reaction gas mixture from which the ammonium halide has been eliminated; and forming a silicon nitride film on a substrate placed in the reaction chamber using the reaction gas mixture, wherein, before feeding to the reaction chamber, the reaction gas mixture obtained from the reaction carried out in the preliminary reaction chamber is heated to a temperature almost equal to a film deposition temperature at which the film will be formed on the substrate.

8. A chemical vapor deposition process comprising the steps of:

feeding to a preliminary reaction chamber a feed gas containing a halogenated silane compound, and a compound selected from the group consisting of ammonia, hydrazine, ammonia derivatives and hydrazine derivatives;

carrying out a preliminary reaction between the silane compound and the compound selected from the group consisting of ammonia, hydrazine, ammonia derivatives and hydrazine derivatives in the preliminary reaction chamber;

eliminating an ammonium halide produced by the preliminary reaction gas mixture produced by the preliminary reaction by controlling the temperature of a section at which the ammonium halide is eliminated;

feeding from outside of a reaction chamber to a reaction chamber the reaction gas mixture from which the ammonium halide has been eliminated; and forming a silicon nitride film on a substrate placed in the reaction chamber using the reaction gas mixture, wherein, before feeding to the reaction chamber, the reaction gas mixture obtained from the reaction carried out in the preliminary reaction chamber is heated to a temperature almost equal to a film deposition temperature at which the film will be formed on the substrate.

* * * * *